United States Patent
Cho et al.

(10) Patent No.: US 7,402,488 B2
(45) Date of Patent: Jul. 22, 2008

(54) METHOD OF MANUFACTURING A SEMICONDUCTOR MEMORY DEVICE

(75) Inventors: Sung-il Cho, Seoul (KR); Kyeong-koo Chi, Seoul (KR); Seung-pil Chung, Seoul (KR); Chang-jin Kang, Suwon-si (KR); Cheol-kyu Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 397 days.

(21) Appl. No.: 11/159,130

(22) Filed: Jun. 23, 2005

(65) Prior Publication Data

US 2005/0287738 A1    Dec. 29, 2005

(30) Foreign Application Priority Data

Jun. 24, 2004    (KR)    ...................... 10-2004-0047658

(51) Int. Cl.
*H01L 21/8242*    (2006.01)
(52) U.S. Cl. ........................ 438/253; 438/396; 438/763; 257/303; 257/E21.008; 257/E21.648; 257/E21.651
(58) Field of Classification Search ................ 438/239, 438/253, 396, 706, 745, 761, 780; 257/303
See application file for complete search history.

(56) References Cited

U.S. PATENT DOCUMENTS

| | | | | |
|---|---|---|---|---|
| 6,444,538 | B2 | 9/2002 | Kwon et al. | 438/396 |
| 6,448,597 | B1 * | 9/2002 | Kasai et al. | 257/295 |
| 6,462,371 | B1 | 10/2002 | Weimer et al. | 257/306 |
| 6,465,351 | B1 | 10/2002 | Jeong | 438/689 |
| 6,653,186 | B2 | 11/2003 | Won et al. | 438/253 |
| 6,982,200 | B2 * | 1/2006 | Noguchi et al. | 438/253 |

* cited by examiner

*Primary Examiner*—Quoc D Hoang
(74) *Attorney, Agent, or Firm*—Lee & Morse, P.C.

(57) ABSTRACT

A method of manufacturing a semiconductor memory device includes forming a carbon-containing layer on a semiconductor substrate, forming an insulating layer pattern on the carbon-containing layer, the insulating layer pattern partially exposing an upper surface of the carbon-containing layer, dry-etching the exposed portion of the carbon-containing layer, to form a carbon-containing layer pattern for defining a storage node hole, forming a bottom electrode inside the storage node hole, forming a dielectric layer on the bottom electrode inside the storage node hole, the dielectric layer covering the bottom electrode, and forming an upper electrode on the dielectric layer inside the storage node hole, the upper electrode covering the dielectric layer.

49 Claims, 10 Drawing Sheets

METHOD OF MANUFACTURING A SEMICONDUCTOR MEMORY DEVICE

BACKGROUND OF THE INVENTION

1. Field of the Invention

The present invention relates to a method of manufacturing a semiconductor memory device. More particularly, the present invention relates to a method of manufacturing a semiconductor memory device having a bottom electrode, which may have a cylindrical-shape, formed in fine cell areas.

2. Description of the Related Art

With a recent trend of more highly-integrated semiconductor memory devices, a design rule of the memory device is reduced, and an area for a unit memory cell thereof is also reduced. A capacitor used in a memory cell of a dynamic random access memory (DRAM) device is required to have a minimum tolerable capacitance sufficient to provide data input/output characteristics and data reading characteristics even though an area thereof is reduced. The reduction of process margins and areas has significantly affected a design of a memory cell capacitor due to the demand as described above. Therefore, various types of a capacitor bottom electrode structure having a three-dimensional structure with a large height have been introduced in order to manufacture a capacitor for maintaining a minimum capacitance even in a reduced space. Among them, a cylindrical-shaped bottom electrode is generally used because it advantageously increases an effective area of a capacitor. Therefore, various technologies regarding a cylindrical-shaped bottom electrode structure and a formation method thereof have been introduced.

Generally, in order to form a cylindrical-shaped bottom electrode, an etch stop layer and a mold oxide layer are formed on a semiconductor substrate having a buried contact formed therein. The mold oxide layer and the etch stop layer are then sequentially dry-etched to form a mold oxide layer pattern and an etch stop layer pattern for defining a node hole exposing the buried contact. A cylindrical-shaped bottom electrode is then formed using the mold oxide layer pattern. After the bottom electrode is formed, the mold oxide layer pattern is removed by a wet etch. In conventional methods of forming a cylindrical-shaped bottom electrode, a silicon nitride layer is generally used as the etch stop layer.

However, in the previously-introduced conventional methods of forming the cylindrical-shaped bottom electrode, an etchant may penetrate through the interface between the bottom electrode and the etch stop layer down to a lower structure, thereby causing damage to the lower structure. In order to prevent this phenomenon, the etch stop layer may be formed thickly to increase a penetration length of the etchant. However, if the thickness of the etch stop layer is increased when the etch stop layer is formed of the silicon nitride layer, the elements in the upper structure may be broken or damaged during dry-etching of the etch stop layer to form the node hole. Further, if the thickness of the etch stop layer is increased, a surface area of the bottom electrode is reduced by as much as the area where the outer wall of the bottom electrode contacts the etch stop layer pattern, thereby failing to provide a desired capacitance.

More specifically, there is a limit in how large the thickness of the etch stop layer may be formed in order to prevent the above problems. Therefore, there is no alternative but to increase a thickness of the mold oxide layer to increase a height of the bottom electrode. However, as the thickness of the mold oxide layer is increased, and a depth of the storage node hole is increased during dry-etching of the storage node hole, a significant deformation of the sectional profile occurs, and a desired sectional profile cannot be maintained, thereby failing to provide a sufficient bottom area of the bottom electrode. The above problems become more serious as the design rule is reduced, which results an increased possibility of generating a twin bit fail in the bottom electrode of a one cylinder stack (OCS) capacitor due to the falling-down of the bottom electrode in addition to failing to provide the desired capacitance.

SUMMARY OF THE INVENTION

The present invention is therefore directed to a method of manufacturing a semiconductor memory device having a bottom electrode, which may have a cylindrical-shape, formed in fine cell areas, which substantially overcomes one or more of the problems due to the limitations and disadvantages of the related art.

It is a feature of an embodiment of the present invention to provide a method of manufacturing a semiconductor memory device including a bottom electrode structure and a peripheral structure thereof, which is suitable to provide a desired capacitance within a narrow memory cell area.

It is another feature of an embodiment of the present invention to provide a method of manufacturing a semiconductor memory device for preventing damage to a lower structure of the device due to a penetration of an etchant during a wet etch for removing a mold oxide layer pattern.

At least one of the above and other features and advantages of the present invention may be realized by providing a method of manufacturing a semiconductor memory device including forming a carbon-containing layer on a semiconductor substrate having a conductive region, forming an insulating layer pattern on the carbon-containing layer, the insulating layer pattern defining a first hole, which partially exposes an upper surface of the carbon-containing layer, dry-etching the carbon-containing layer exposed through the first hole, to form a carbon-containing layer pattern for defining a second hole exposing the conductive region of the semiconductor substrate, forming a bottom electrode inside the first hole and the second hole, forming a dielectric layer on a resultant structure, and forming an upper electrode on the dielectric layer.

The resultant structure may be the bottom electrode and the insulating layer pattern.

Alternatively, the method may further include, prior to forming the dielectric layer, removing the insulating layer pattern by a wet etch, and removing the carbon-containing layer pattern, so that the resultant structure may be the bottom electrode and the semiconductor substrate. The method may further include exposing outer sidewalls of the bottom electrode completely, after removing the carbon-containing layer pattern.

The bottom electrode may have a cylindrical-shape.

The conductive region of the semiconductor substrate may be a conductive contact plug formed on the semiconductor substrate, the conductive contact plug being connected to an active region of the semiconductor substrate.

At least one of the above and other features and advantages of the present invention may be realized by providing a method of manufacturing a semiconductor memory device including forming a carbon-containing layer on a semiconductor substrate, forming an insulating layer pattern on the carbon-containing layer, the insulating layer pattern partially exposing an upper surface of the carbon-containing layer, dry-etching the exposed portion of the carbon-containing layer, to form a carbon-containing layer pattern for defining a storage node hole, forming a bottom electrode inside the storage node hole, forming a dielectric layer on the bottom electrode inside the storage node hole, the dielectric layer covering the bottom electrode, and forming an upper electrode on the dielectric layer inside the storage node hole, the upper electrode covering the dielectric layer.

In either method, the carbon-containing layer may be composed of one selected from the group consisting of amorphous carbon, diamond like carbon (DLC), graphite, aliphatic or aromatic hydrocarbon compound, organic polymer compound, SiLK™, SiCOH composite material, and a-SiC: H.

In either method, forming the carbon-containing layer may include performing a plasma-enhanced chemical vapor deposition (PECVD) method or a spin coating method.

In either method, the insulating layer pattern may be composed of one selected from the group consisting of PE-TEOS, undoped silicate glass (USG), borophosphosilicate glass (BPSG), phosphosilicate glass (PSG), and polysilazane.

In either method, forming the insulating layer pattern may include forming an insulating layer on the carbon-containing layer and dry-etching the insulating layer using a photoresist pattern as an etch mask. Forming the insulating layer may include performing a PECVD method or a spin coating method. Forming the insulating layer may be performed at a temperature equal to or lower than about 450° C. In the first method, dry-etching the carbon-containing layer to form the carbon-containing layer pattern may include removing the photoresist pattern simultaneously with the formation of the second hole. In the second method, dry-etching the carbon-containing layer to form the carbon-containing layer pattern may include removing the photoresist pattern simultaneously with the formation of the storage node hole.

In either method, forming the carbon-containing layer pattern may include forming sidewalls of the carbon-containing layer pattern to have a vertical profile.

In either method, forming the carbon-containing layer pattern may include dry-etching the carbon-containing layer at a temperature of about 20 to about 80° C. Dry-etching the carbon-containing layer may include using etch gases including $O_2$ gas, an inert gas, and at least one auxiliary gas selected from group consisting of HBr, $NH_3$, and $H_2$, during the formation of the carbon-containing layer pattern.

In the first method, the carbon-containing layer may be isotropically dry-etched during the formation of the carbon-containing layer pattern, to form the second hole having a greater outer diameter than that of the first hole. In the second method, the carbon-containing layer may be isotropically dry-etched during the formation of the carbon-containing layer pattern, to form a lower portion of the storage node hole to have a greater outer diameter than an upper portion of the storage node hole. In either method, forming the carbon-containing layer pattern may include dry-etching the carbon-containing layer using etch gases including $O_2$ gas and an inert gas.

In either method, a height of the carbon-containing layer may be equal to or greater than about 1/5 of a height of the bottom electrode.

In either method, removing the carbon-containing layer pattern may include performing an ashing process and a stripping process.

In the first method, forming the bottom electrode may include forming a conductive layer on sidewalls of the carbon-containing layer pattern, on sidewalls of the insulating layer pattern, and on the insulating layer pattern, forming a sacrificial layer inside the first hole and the second hole, the sacrificial layer covering the conductive layer, removing the sacrificial layer and the conductive layer formed on the insulating layer pattern until an upper surface of the insulating layer pattern is exposed, and removing the sacrificial layer completely.

In the second method, forming the bottom electrode may include forming a conductive layer on sidewalls of the carbon-containing layer pattern, on sidewalls of the insulating layer pattern, and on the insulating layer pattern, forming a sacrificial layer inside the storage node hole, to cover the conductive layer, removing the sacrificial layer and the conductive layer on the insulating layer pattern until an upper surface of the insulating layer pattern is exposed, and removing the sacrificial layer completely.

In either method, the sacrificial layer may be composed of one selected from the group consisting of USG, $SiO_2$, polysilazane, and photoresist. Removing the sacrificial layer and the conductive layer may include performing a chemical mechanical polishing (CMP) process or an etch back process. Removing the sacrificial layer completely may include performing a wet etch.

The sacrificial layer may be composed of an oxide, and either method may further include prior to forming the dielectric layer, removing the insulating layer pattern by a wet etch; and removing the carbon-containing layer pattern, wherein removing the sacrificial layer completely and removing the insulating layer pattern are performed simultaneously.

In either method, removing the sacrificial layer completely may include performing an ashing process and a stripping process.

The sacrificial layer may be composed of photoresist, and either method may further include prior to forming the dielectric layer, removing the insulating layer pattern by a wet etch; and removing the carbon-containing layer pattern, wherein removing the sacrificial layer completely and removing the carbon-containing layer pattern are performed simultaneously.

In the first method, the upper electrode may be formed inside the first hole and the second hole.

According to the present invention, a carbon-containing layer pattern is formed with a relatively large height as a lower mold layer in the formation of a bottom electrode of an OCS capacitor. Therefore, a lower structure of the device is not damaged by an etchant during a wet-etch for removing an oxide layer pattern as an upper mold layer, since the penetration length of the etchant down to the lower structure is increased due to the large height of the carbon-containing layer pattern. Further, it is possible to form a storage node hole having a greater outer diameter at a lower portion thereof than an outer diameter at an upper portion thereof, using the isotropic etch characteristics of a carbon-containing layer during the dry-etch of the carbon-containing layer for forming the lower mold layer. As such, a bottom electrode formed inside a storage node hole structured as above can have a stable structure because a lower outer diameter thereof is greater than an upper outer diameter thereof. Therefore, the bottom electrode of an OCS capacitor can be prevented from falling down, and a height of the bottom electrode can be readily increased without generation of a twin bit fail.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1A:
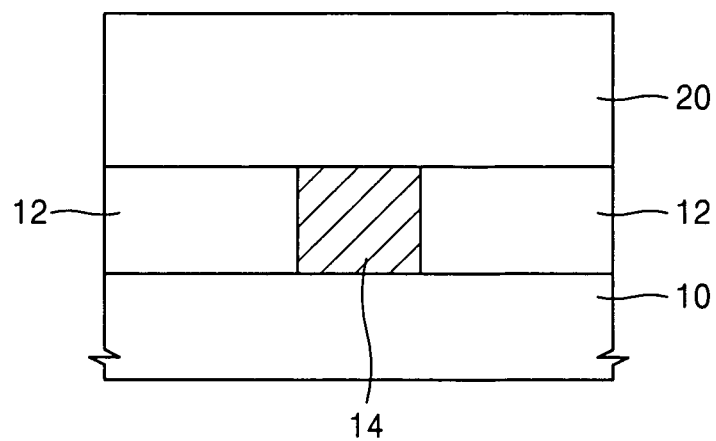
FIGS. 1A through 1J illustrate sectional views of sequential processing stages in a method of manufacturing a semiconductor memory device according to a first embodiment of the present invention.

Korean Patent Application No. 2004-47658, filed on Jun. 24, 2004, in the Korean Intellectual Property Office, and entitled: "Method of Manufacturing Semiconductor Memory Device," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of films, layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIGS. 1A through 1J illustrate sectional views of sequential processing stages in a method of manufacturing a semiconductor memory device according to a first embodiment of the present invention. In the first embodiment, a method of forming an OCS capacitor of a semiconductor memory device will be explained.

Referring to FIG. 1A, an interlayer insulating layer 12 is formed on a semiconductor substrate 10. The interlayer insulating layer 12 is partially etched to form a storage node contact hole, and the contact hole is then filled with a conductive material and the conductive material is planarized, to form a conductive contact plug 14, which is connected to an active region of the semiconductor substrate 10.

A carbon-containing layer 20 is formed on the interlayer insulating layer 12 and the contact plug 14. The carbon-containing layer 20 is used as an etch stop layer during a subsequent process, and it may be relatively thick, e.g., with a thickness of about 1,000 to about 15,000 Å.

The carbon-containing layer 20 may be formed of a pure carbon layer, e.g., an amorphous carbon layer, a diamond like carbon (DLC) layer, or graphite. In order to form the carbon-containing layer 20 composed of a pure carbon layer as described above, a plasma-enhanced chemical vapor deposition (PECVD) method, for example, may be used, and one kind of a single gas of $C_xH_y$, or at least two kinds of mixing gases of $C_xH_y$, and a process gas, such as hydrogen ($H_2$), helium (He), or argon (Ar) may be used.

Further, the carbon-containing layer 20 may be composed of an aliphatic or aromatic hydrocarbon compound, an organic polymer compound, or a carbon-containing low-k dielectric material. The organic polymer compound may use photoresist. Representative examples of the carbon-containing low-k dielectric material include SiLK™, which is a product of The Dow Chemical Company, an SiCOH composite material, or an amorphous hydride silicon carbide (a-SiC:H). The SiLK™ layer is an SOD (spin-on-dielectric) polymer layer, which is formed by a spin-coating, and after the spin-coating, it is baked at a temperature of about 400 to 450° C. An SiCOH composite layer may be formed using, e.g., trimethylsilane, tetramethylsilane, hexamethyldisiloxane, bis-trimethylsilymetane, or vinyltrimethylsilane as a precursor, by a PECVD method. An a-SiC: H layer may be formed using trimethylsilane as a precursor, by a PECVD method.

Figure 1B:
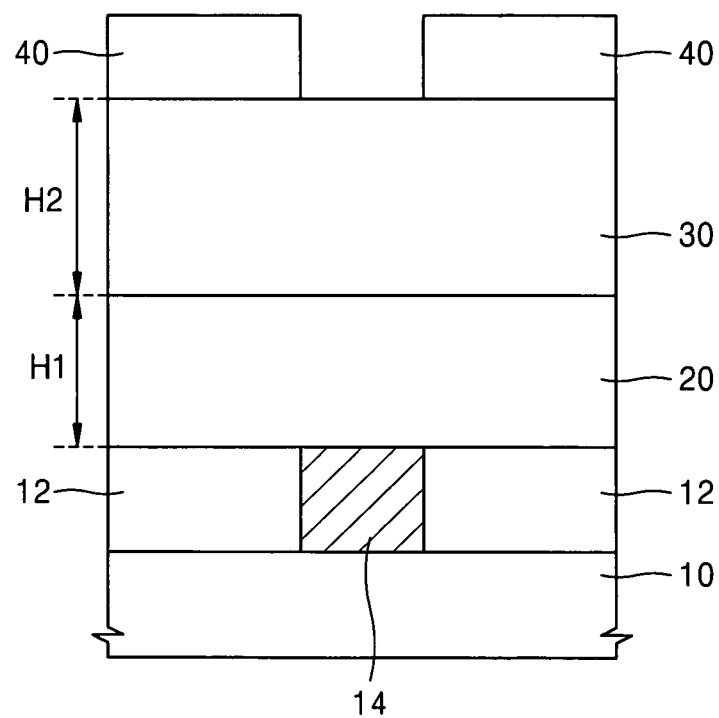

Referring to FIG. 1B, an oxide layer 30 is formed on the carbon-containing layer 20. The oxide layer 30 is used as a mold layer along with the carbon-containing layer 20 when a bottom electrode is formed in a subsequent process, and may be formed, e.g., with a thickness of about 10,000 to about 25,000 Å. A sum (H1+H2) of a height H1 of the carbon-containing layer 20 and a height H2 of the oxide layer 30 is determined depending on a height of the bottom electrode, which will be subsequently formed. The height H1 of the carbon-containing layer 20 may preferably be equal to or greater than about ⅓ of the height of the bottom electrode.

The oxide layer 30 may be formed of a TEOS layer formed by a PECVD method (hereinafter, referred to as "PE-TEOS layer"), an undoped silicate glass (USG) layer formed by a spin coating method, a borophosphosilicate glass (BPSG) layer, a phosphosilicate glass (PSG) layer, or a polysilazane layer.

When the oxide layer 30 is formed at a relatively high temperature, e.g., above about 600° C., the carbon inside the carbon-containing layer 20 decomposes in the high temperature atmosphere to generate a gas, thereby causing a lifting phenomenon in the carbon-containing layer 20. To avoid this lifting phenomenon, the oxide layer 30 may preferably be composed of a material, which can be formed as a layer at a relatively low temperature, e.g., below about 450° C.

A PE-TEOS layer can be formed at a temperature of about 400° C. by a PECVD method, and a USG layer can be formed a temperature of about 450 to about 540° C. by a spin coating method. Further, a polysilazane layer can be formed at a temperature of about 400 to about 700° C. by a spin coating method. Thus, the oxide layer 30 may preferably be formed of a PE-TEOS layer, a USG layer, or a polysilazane layer.

A photoresist pattern 40 for defining a storage node hole region is formed on the oxide layer 30, with a thickness of about 5,000 to about 10,000 Å.

Figure 1C:
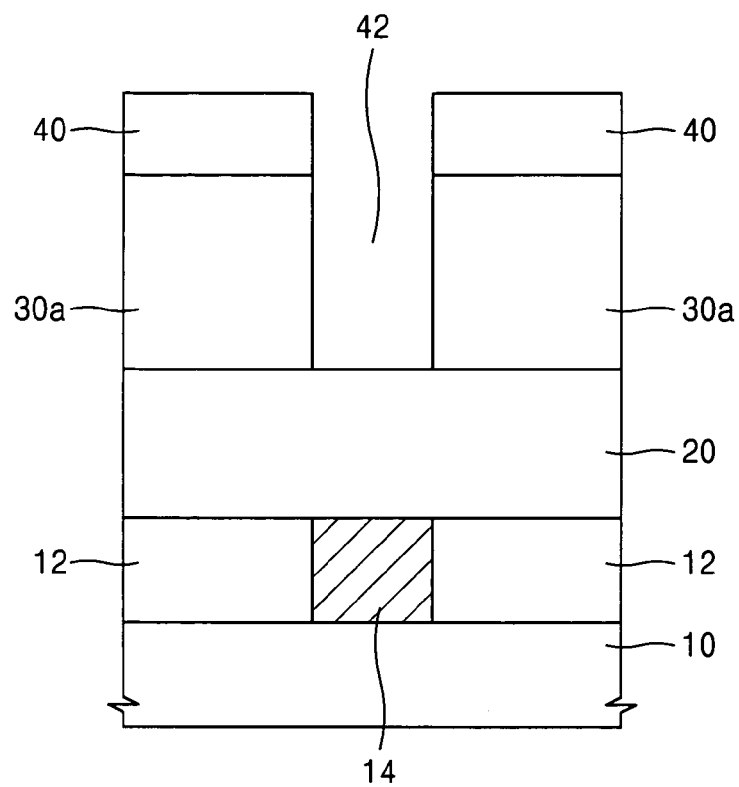

Referring to FIG. 1C, the oxide layer 30 is dry-etched using the photoresist pattern 40 as an etch mask, to form an oxide layer pattern 30a. The dry etch of the oxide layer 30 may be performed using a $CF_x$ group of an etch gas, e.g., $C_4F_6$ or $C_3F_9$ gas and an Ar gas. As a result of this etching, an upper surface of the carbon-containing layer 20 is partially exposed through a first hole 42 formed in the oxide layer pattern 30a.

Figure 1D:
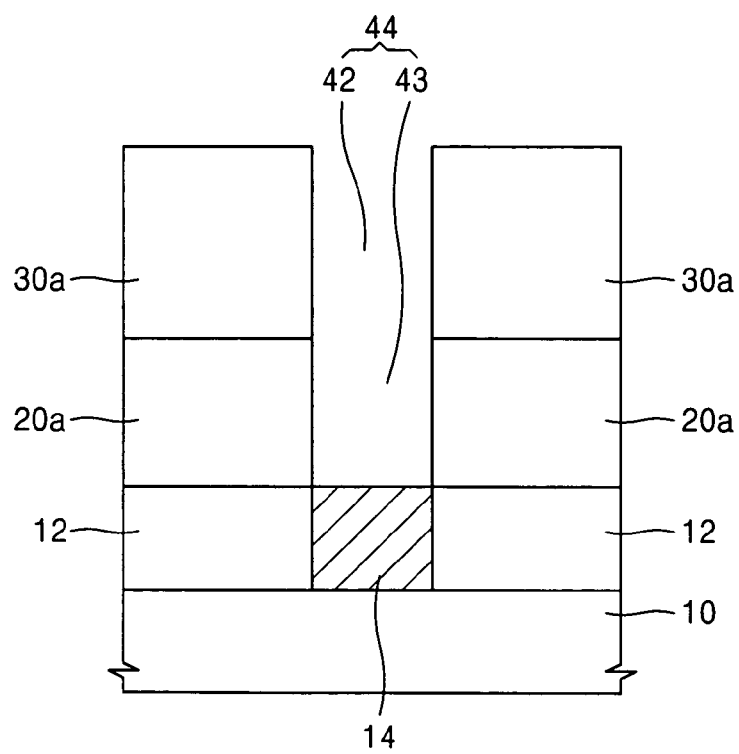

Referring to FIG. 1D, the exposed portion of the carbon-containing layer 20 is dry-etched using the oxide layer pattern 30a as an etch mask, to form a carbon-containing layer pattern 20a for exposing a contact plug 14 through a second hole 43. A storage node hole 44 includes the first hole 42 and the second hole 43. The dry etch of the carbon-containing layer 20 may use a plasma etch method using oxygen ($O_2$) gas as a main source gas. Along with the main source gas, at least one inert gas selected from nitrogen ($N_2$), Ar, and He may also be supplied at the same time. Further, when the carbon-containing layer 20 includes Si, e.g., an SiCOH composite layer or an a-SiC:H layer, the source gas may further include fluorine (F) to perform the etch process.

As shown in FIG. 1D, in order to form sidewalls of the carbon-containing layer pattern 20a to have a vertical profile, HBr, $NH_3$, or $H_2$ may be added to the source gas for etching the carbon-containing layer 20, thereby suppressing the isotropic etch characteristics of the carbon-containing layer 20 and improving an etch speed.

The dry etch of the carbon-containing layer 20 may be performed under etch conditions of about 100 to about 1,500 W of power, and about 3 to about 100 mT of pressure. Since the carbon-containing layer 20 exhibits the isotropic etch characteristics when an etch temperature is increased, it is necessary to set the etch temperature as low as possible. The etch temperature may preferably be about 20 to about 80° C. in order to maintain the vertical profile of the sidewalls of the carbon-containing layer pattern 20a.

The photoresist pattern 40 may be removed by a separate process after the dry etch of the carbon-containing layer 20. Alternatively, when the carbon-containing layer 20 is composed of an organic polymer material, e.g., photoresist, the photoresist pattern 40 may be removed together with the carbon-containing layer 20 during the dry etch process under the etch conditions of the carbon-containing layer 20. In this case, a separate process is not necessary to remove the photoresist pattern 40, thereby advantageously reducing a total number of processing operations.

Further, an etch selectivity of the carbon-containing layer 20 relative to the oxide layer is very high under the dry etch conditions of the carbon-containing layer 20. More specifically, since the oxide layer pattern 30a is not damaged during the dry etch of the carbon-containing layer 20, there is no concern that a profile of the bottom electrode to be formed in a subsequent process will be adversely affected.

Figure 1E:
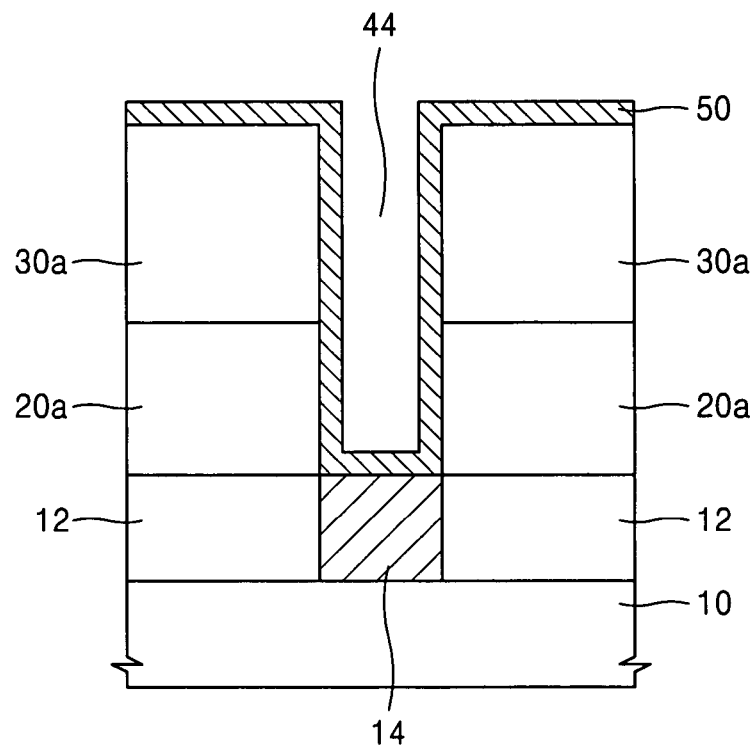

Referring to FIG. 1E, a conductive layer 50 for forming a bottom electrode is formed on the contact plug 14, the sidewalls of the carbon-containing layer pattern 20a, and the sidewalls of the oxide layer pattern 30a, which are exposed through the storage node hole 44, and on the oxide layer pattern 30a. The conductive layer 50 may have a thickness of about 200 to about 400 Å, and may be composed of, e.g., doped polysilicon or TiN, or a noble metal material, such as platinum (Pt), ruthenium (Ru), iridium (Ir), or an oxide thereof. The conductive layer 50 may be formed of a single layer composed of one of the above materials or composite layers of at least two materials. The conductive layer 50 may be formed using, e.g., a CVD or an ALD method.

Figure 1F:
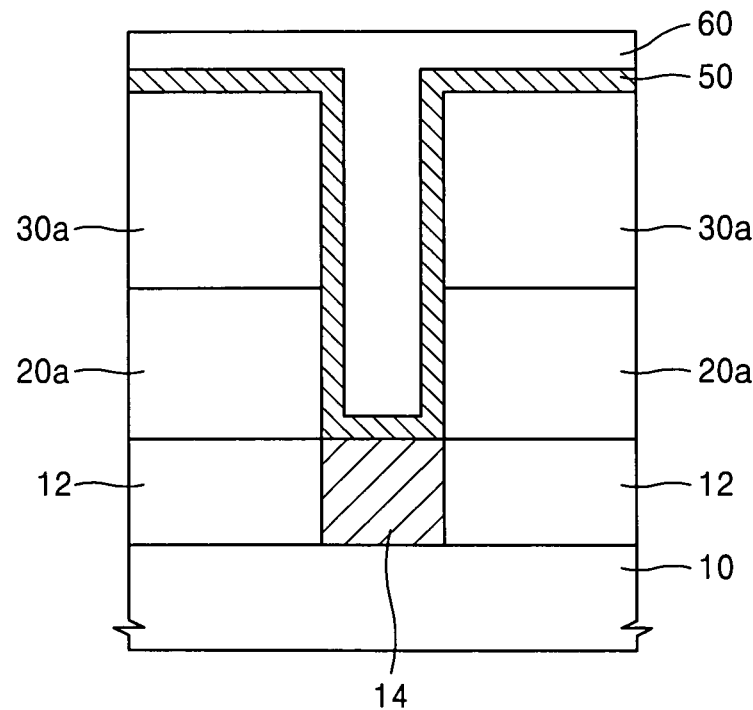

Referring to FIG. 1F, a sacrificial layer 60 is formed on an entire surface of the resultant structure having the conductive layer 50. The sacrificial layer 60 is also formed to cover the conductive layer 50 inside the storage node hole 44.

The sacrificial layer 60 may be composed of an oxide having a good gap filling property, e.g., USG, $SiO_2$, polysilazane, or photoresist.

Figure 1G:
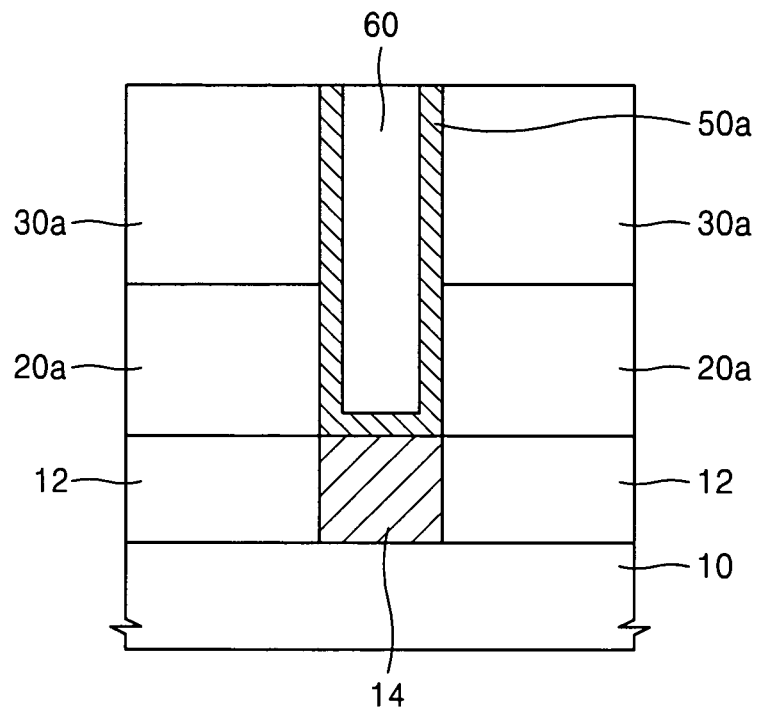

Referring to FIG. 1G, the sacrificial layer 60 and the conductive layer 50, which are formed on the oxide layer pattern 30a, are removed by a chemical mechanical polishing (CMP) process or an etch back process until the oxide layer pattern 30a is exposed, thereby forming a bottom electrode 50a, which is separated in each cell.

Figure 1H:
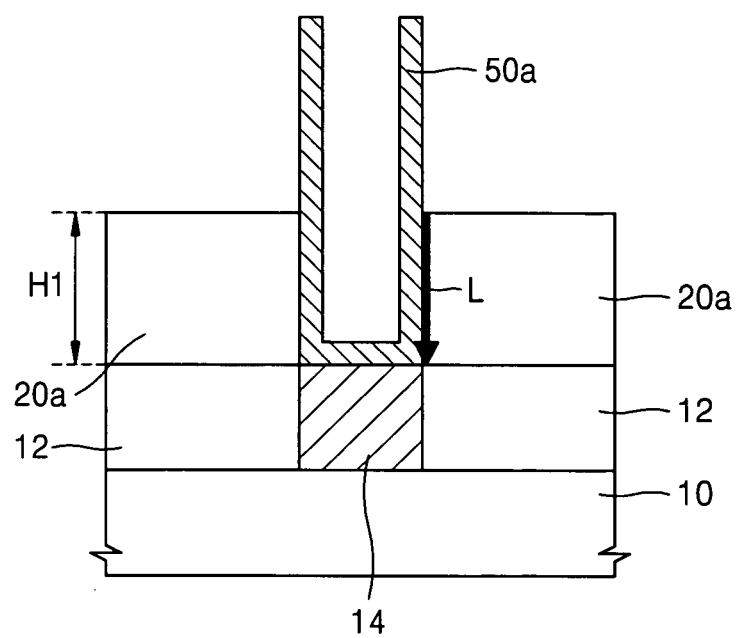

Referring to FIG. 1H, the oxide layer pattern 30a is removed. In order to remove the oxide layer pattern 30a, an etchant, which is normally used to remove the oxide layer, is used, and, e.g., an etchant such as a mixture of HF and $NH_4F$ may be used. Since the carbon-containing layer pattern 20a remaining around the bottom electrode 50a has a height H1 higher than that of a conventional silicon nitride layer formed as an etch stop layer, a penetrating length L of the etchant down into the structure during the wet etch of the oxide layer pattern 30a is long. Therefore, the structure remaining under the bottom electrode 50a is not damaged by the etchant during the wet etch of the oxide layer pattern 30a.

At this time, when the sacrificial layer 60 is composed of an oxide, the oxide layer pattern 30a and the sacrificial layer 60 are removed simultaneously, as shown in FIG. 1H. Even though not depicted in the drawing, when the sacrificial layer 60 is composed of photoresist, the sacrificial layer 60 may remain even after the oxide layer pattern 30a is removed. This aspect will be subsequently explained.

Figure 1I:
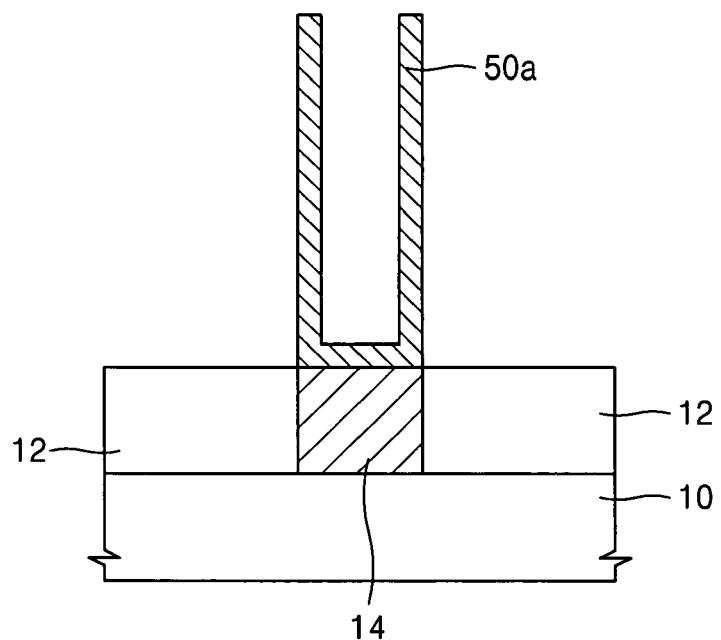

Referring to FIG. 1I, the carbon-containing layer pattern 20a is removed using an ashing and a stripping. As a result, outer sidewalls of the bottom electrode 50a are completely exposed.

Referring back to the discussion of FIG. 1H, when the sacrificial layer 60 is composed of photoresist, the sacrificial layer 60 may remain even after the oxide layer pattern 30a is removed as described above. The remaining sacrificial layer 60 can be removed along with the removal of the carbon-containing layer pattern 20a, during the ashing and stripping processes for removing the carbon-containing layer pattern 20a. Therefore, it is not necessary to perform a separate process to remove the sacrificial layer 60.

Figure 1J:
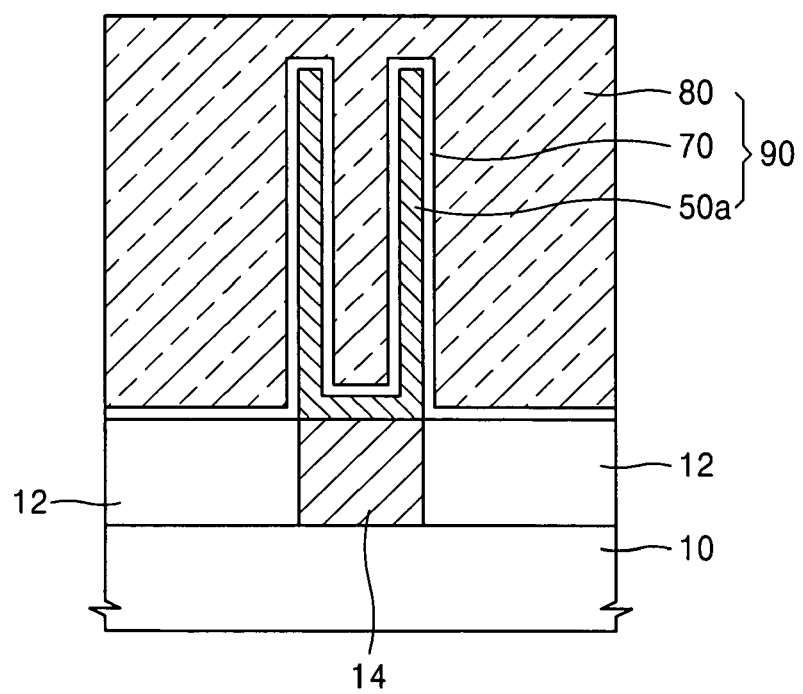

Referring to FIG. 1J, a dielectric layer 70 and an upper electrode 80 are sequentially formed on the bottom electrode 50a, thereby completing the formation of a capacitor 90.

FIGS. 2A through 2D illustrate sectional views of sequential processing stages in a method of manufacturing a semiconductor memory device according to a second embodiment of the present invention. Although the method of the second embodiment is substantially the same as the method of the first embodiment, in the second embodiment, a lower outer diameter of a bottom electrode in an OCS capacitor is greater than an upper outer diameter of the bottom electrode. A method of forming such a structure will now be described. In FIGS. 2A through 2D, like reference numerals refer to like elements of the first embodiment, and a detailed explanation thereof will not be repeated.

Figure 2A:
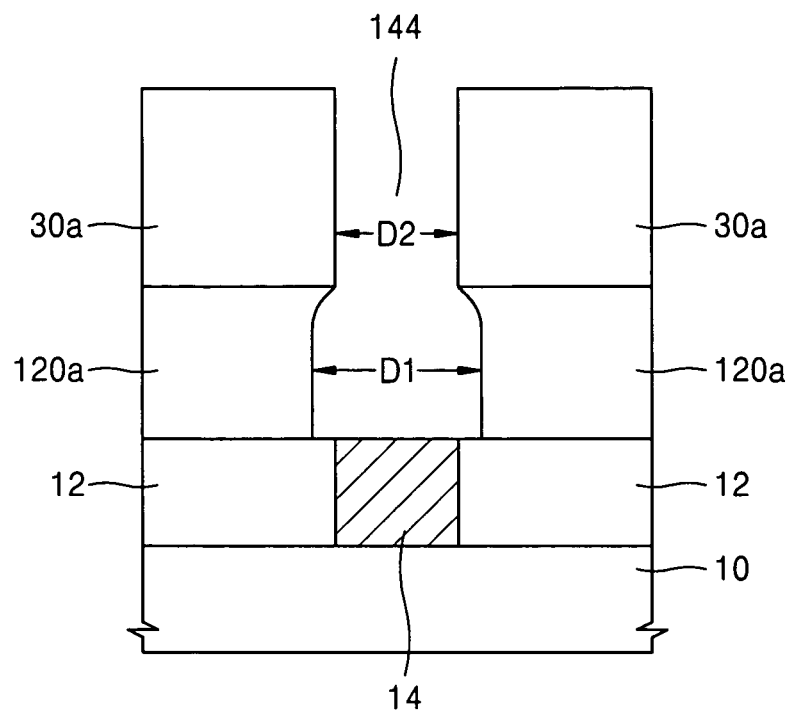
FIGS. 2A through 2D illustrate sectional views of sequential processing stages in a method of manufacturing a semiconductor memory device according to a second embodiment of the present invention.

Referring to FIG. 2A, after the oxide layer pattern 30a is formed in the same way as described in connection with FIGS. 1A through 1C, an exposed portion of the carbon-containing layer 20 is dry-etched using the oxide layer pattern 30a as an etch mask in substantially the same method as described in the first embodiment in connection with FIG. 1D to form a hole for exposing an upper surface of the contact plug 14. However, the above method differs from that of the first embodiment, in that the carbon-containing layer 20 is dry-etched by a plasma etch method using $O_2$ gas as a main source gas, and an amount of HBr, $NH_3$, or $H_2$ in the etch gas is lowered as compared to that of the first embodiment, in order to achieve an isotropic etch effect of the carbon-containing layer 20, and an etch temperature is increased in comparison with that of the first embodiment. As a result, a carbon-containing layer pattern 120a for defining a storage node hole 144 exposing the contact plug 14 is formed. In the storage node hole 144, an outer diameter D1 of the hole defined by the carbon-containing layer pattern 120a is greater than an outer diameter D2 of the hole defined by the oxide layer pattern 30a. More specifically, the outer diameter D1 of the storage node hole 144 formed within the carbon-containing layer pattern 120a is greater than the outer diameter D2 of the storage node hole 144 formed within the oxide layer pattern 30a.

Figure 2B:
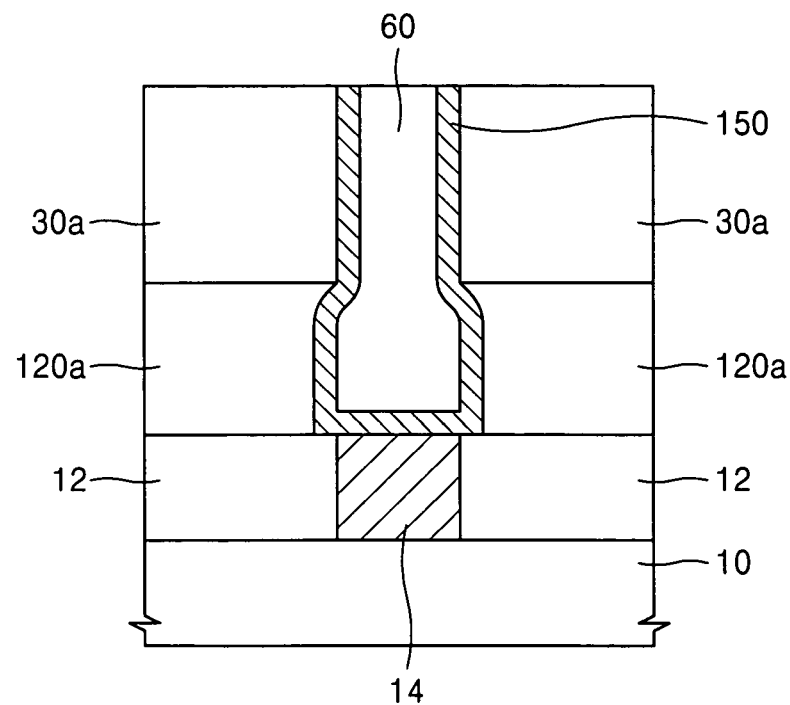

Referring to FIG. 2B, a conductive layer for a bottom electrode is formed inside the storage node hole 144 and on the oxide layer pattern 30a in the same method as described in connection with FIGS. 1E through 1G. Then, the sacrificial layer 60 is formed, and the sacrificial layer 60 and the conductive layer are removed by a CMP process or an etch back process to form a bottom electrode 150, which is separated in each cell. The bottom electrode 150 that is formed inside the storage node hole 144, which has a greater outer diameter at a lower portion thereof than at an upper portion thereof, may have a more stable structure because the lower outer diameter of the electrode is greater than the upper outer diameter thereof. Therefore, the bottom electrode may be prevented from falling down in the OCS capacitor, and generation of a twin bit fail may be prevented.

Figure 2C:
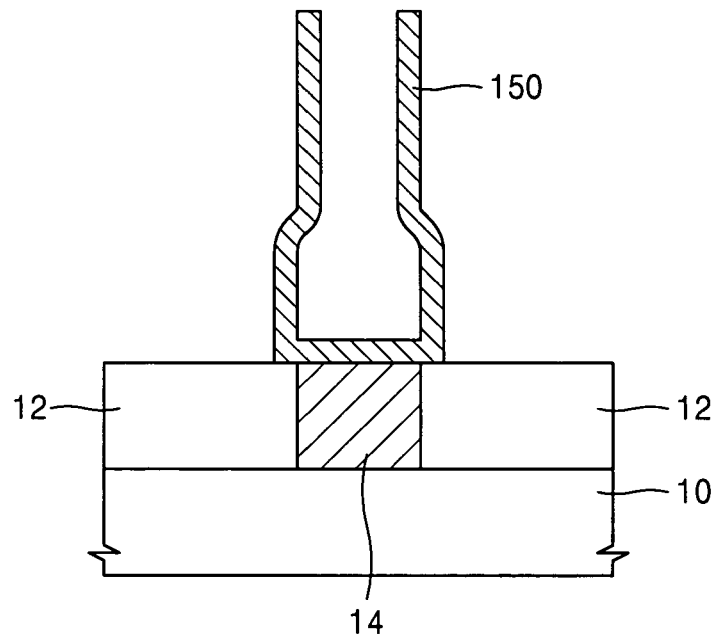

Referring to FIG. 2C, the oxide layer pattern 30a, the sacrificial layer 60, and the carbon-containing layer pattern 120a are removed in the same method as described in connection with FIGS. 1H through 1I.

Figure 2D:
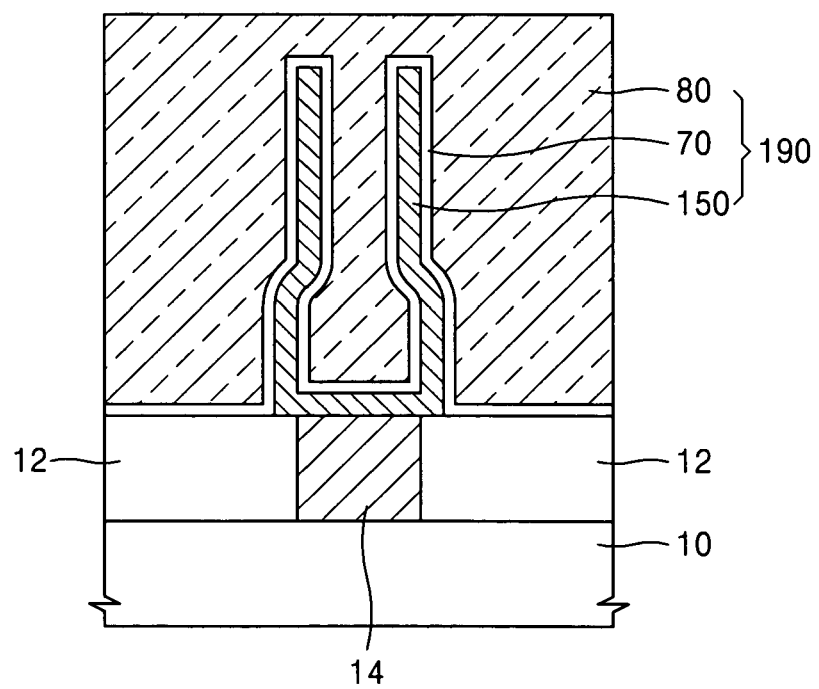

Referring to FIG. 2D, the dielectric layer 70 and the upper electrode 80 are sequentially formed on the bottom electrode 150 in the same method as described in connection with FIG. 1J, thereby completing the formation of a capacitor 190.

Figure 3A:
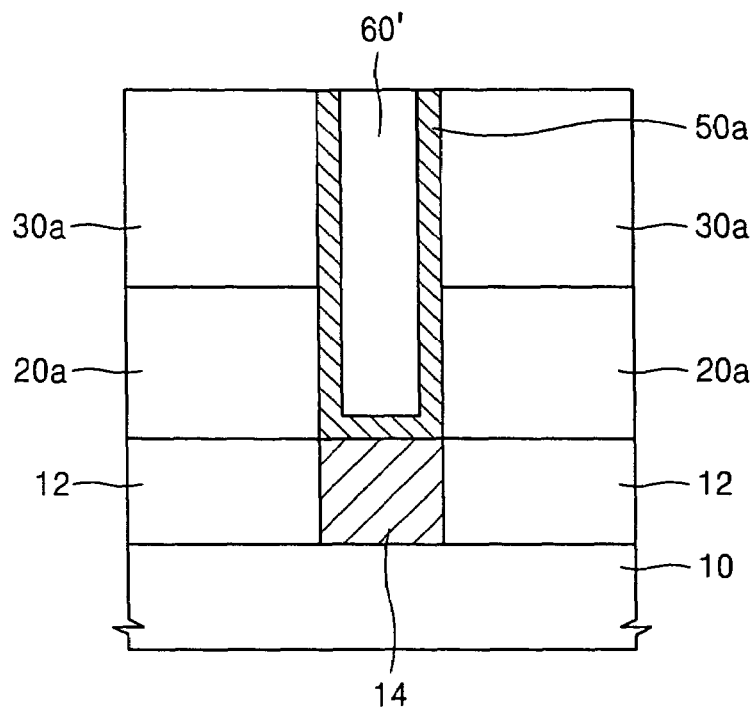
FIGS. 3A through 3C illustrate sectional views of sequential processing stages in a method of manufacturing a semiconductor memory device according to a third embodiment of the present invention.
Figure 3B:
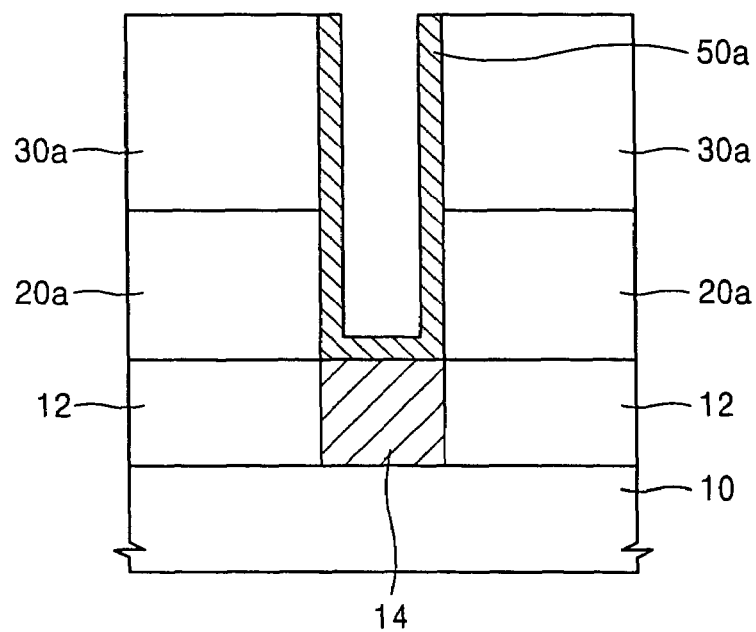
Figure 3C:
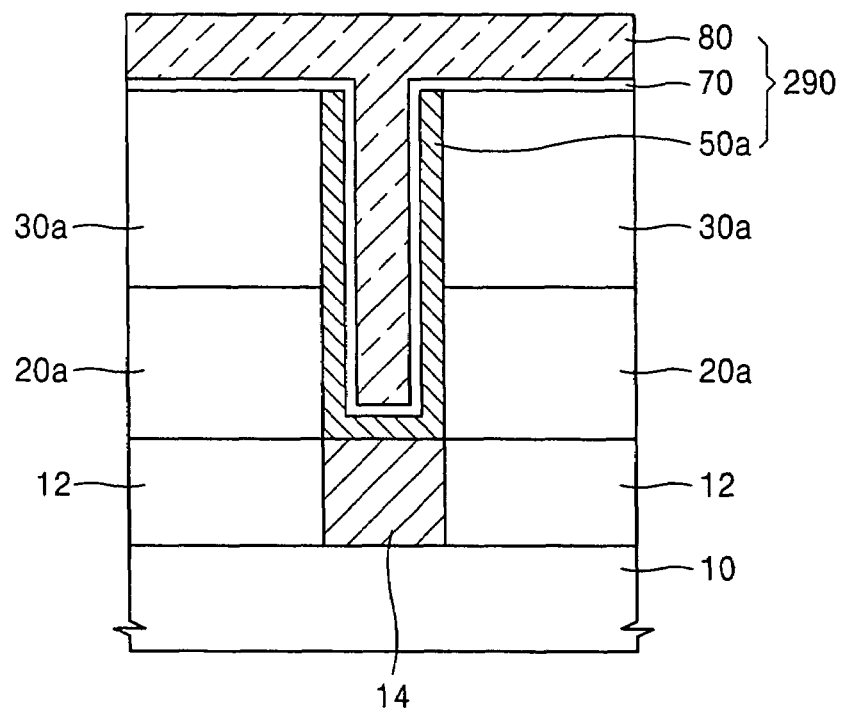

FIGS. 3A through 3C illustrate sectional views of sequential processing stages in a method of manufacturing a semiconductor memory device according to a third embodiment of the present invention. In the third embodiment, a method of forming a concave type capacitor of a semiconductor memory device will be explained. In FIGS. 3A through 3C, like reference numerals refer to like elements of the first embodiment, and a detailed explanation thereof will not be repeated.

Referring to FIG. 3A, the bottom electrode 50a is formed by the same method as described in connection with FIGS. 1A through 1G. However, a sacrificial layer 60', which is formed to protect the bottom electrode 50a during a CMP process for separating a node, is composed of photoresist in order to provide an etch selectivity relative to an oxide layer pattern 30a. Further, the carbon-containing layer pattern 20a is not removed from around the bottom electrode 50a after a capacitor is formed. Because the carbon-containing layer pattern 20a remains, it may preferably be composed of a low-k dielectric material, such as SiLK™, SiCOH composite material, a-SiC:H, or the like.

Referring to FIG. 3B, the sacrificial layer 60' is removed by ashing and stripping processes to expose inner sidewalls of the bottom electrode 50a.

Referring to FIG. 3C, the dielectric layer 70 and the upper electrode 80 are sequentially formed on the bottom electrode 50a in the same method as described in connection with FIG. 1J, thereby completing the formation of a capacitor 290.

Figure 4A:
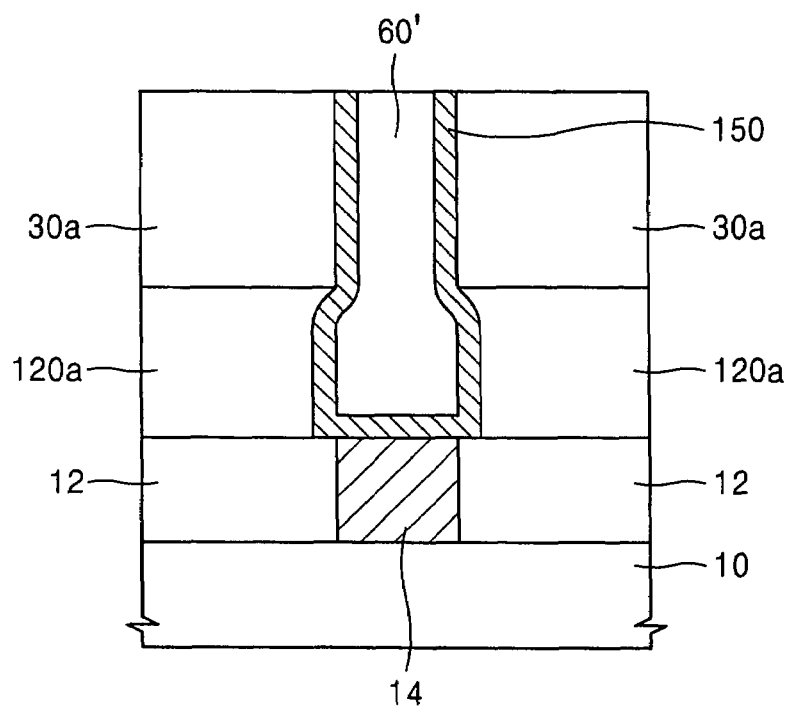
FIGS. 4A through 4C illustrate sectional views of sequential processing stages in a method of manufacturing a semiconductor memory device according to a fourth embodiment of the present invention.
Figure 4B:
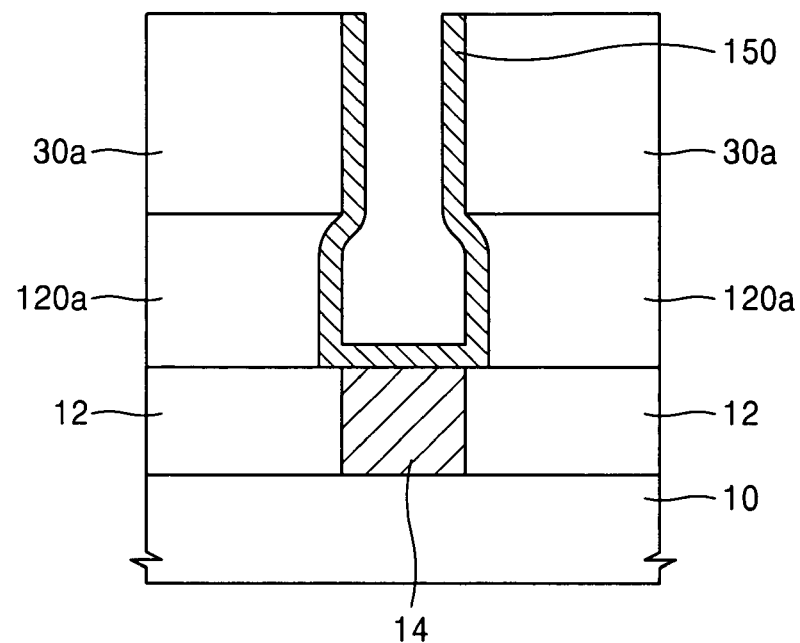
Figure 4C:
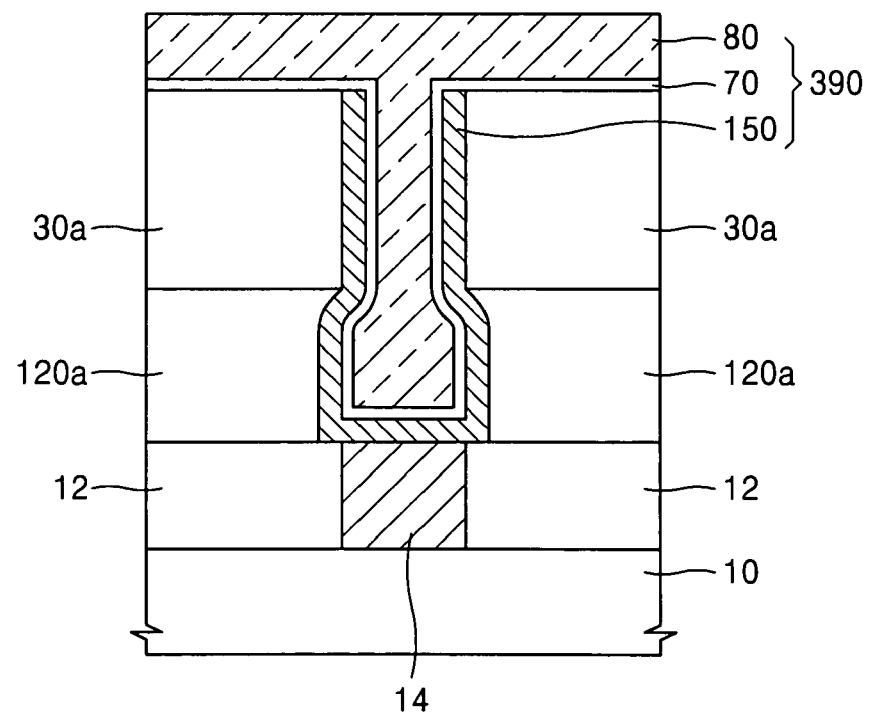

FIGS. 4A through 4C illustrate sectional views of sequential processing stages in a method of manufacturing a semiconductor memory device according to a fourth embodiment of the present invention. In the fourth embodiment, a method of forming a concave type capacitor of a semiconductor memory device will be explained. The method of the fourth embodiment of the present invention is substantially the same as the method of the third embodiment, however, in the fourth embodiment, a lower outer diameter of a bottom electrode in a concave type capacitor is greater than an upper outer diameter of the bottom electrode. A method of forming such a structure will now be described. In FIGS. 4A through 4C, like reference numerals refer to like elements of the first, second, and third embodiments, and a detailed explanation thereof will not be repeated.

Referring to FIG. 4A, the bottom electrode 150 is formed by the same method as described in connection FIGS. 2A and 2B. However, the sacrificial layer 60', which is formed to protect the bottom electrode 150 during a CMP process for separating a node, is composed of photoresist in order to provide an etch selectivity relative to an oxide layer pattern 30a, as in the third embodiment. Further, the carbon-containing layer pattern 120a is not removed from around the bottom electrode 150 after a capacitor is formed. Since the carbon-containing layer pattern 120a remains, it may preferably be composed of a low-k dielectric material, e.g., SiLK™, SiCOH composite material, a-SiC:H, or the like.

Referring to FIG. 4B, the sacrificial layer 60' is removed by ashing and stripping processes, to expose the inner sidewalls of the bottom electrode 150.

Referring to FIG. 4C, the dielectric layer 70 and the upper electrode 80 are sequentially formed on the bottom electrode 150 in the same method as described in connection with FIG. 1J, thereby completing the formation of a capacitor 390.

The methods of manufacturing a semiconductor device according to the various embodiments of the present invention offer the following several advantages.

In the formation of a bottom electrode of an OCS capacitor according to the various embodiments of the present invention, a carbon-containing layer pattern having a relatively large height and an oxide layer pattern formed thereon are used as a mold layer. Due to the large height of the carbon-containing layer pattern, a penetration length of an etchant down to a structure during a wet etch for removing the oxide layer pattern is increased, thereby preventing damage to the lower structure by the etchant.

Since a carbon-containing layer is formed to be thick under the above patterns to form the mold layer, even though a relatively thin oxide layer is formed on the carbon-containing layer, a height of a bottom electrode can be increased. More specifically, even through the bottom electrode is formed thickly, an etch amount of an oxide layer for forming a storage node hole is reduced as compared to that of the conventional case. Unlike the conventional technology, in which a deformation problem of the sectional profile of the storage node hole becomes more serious, as an etch depth of the oxide layer is increased, a desired sectional profile can be maintained depending on a depth of the storage node hole even though the storage node hole is formed deeply according to the various embodiments of the present invention.

Further, a storage node hole may be formed such that a lower outer diameter thereof is greater than an upper outer diameter thereof, by dry-etching the carbon-containing layer for forming the mold layer and using the isotropic etch characteristics of the carbon-containing layer. A bottom electrode, which is formed inside the storage node hole having a structure as described above, has a more stable structure because a lower outer diameter thereof is greater than an upper outer diameter thereof. Therefore, the bottom electrode of an OCS capacitor may be prevented from falling down, and the bottom electrode may be readily formed to have an increased height, without generating a twin bit fail.

Further, the carbon-containing layer pattern used as a mold layer may be employed in the same way as in the formation of the bottom electrode of a concave type capacitor, and the carbon-containing layer, may be composed of a low-k dielectric material, thereby providing an insulating layer having an excellent insulating property.

Therefore, according to the embodiments of the present invention, a bottom electrode for providing a sufficient capacitance can be formed in the fabrication of a highly-integrated semiconductor memory device having a small design rule.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a semiconductor memory device, comprising:
    forming a carbon-containing layer on a semiconductor substrate having a conductive region;
    forming an insulating layer pattern on the carbon-containing layer, the insulating layer pattern defining a first hole, which partially exposes an upper surface of the carbon-containing layer;
    dry-etching the carbon-containing layer exposed through the first hole, to form a carbon-containing layer pattern for defining a second hole exposing the conductive region of the semiconductor substrate;
    forming a bottom electrode inside the first hole and the second hole;
    removing the insulating layer pattern;
    removing the carbon-containing layer pattern;
    forming a dielectric layer on a resultant structure; and
    forming an upper electrode on the dielectric layer.

2. The method as claimed in claim 1, wherein the resultant structure is the bottom electrode and the semiconductor substrate.

3. The method as claimed in claim 1, further comprising:
    removing the insulating layer pattern by a wet etch.

4. The method as claimed in claim 1, further comprising exposing outer sidewalls of the bottom electrode completely, after removing the carbon-containing layer pattern.

5. The method as claimed in claim 1, wherein the bottom electrode has a cylindrical-shape.

6. The method as claimed in claim 1, wherein the conductive region of the semiconductor substrate is a conductive contact plug formed on the semiconductor substrate, the conductive contact plug being connected to an active region of the semiconductor substrate.

7. The method as claimed in claim 1, wherein the carbon-containing layer is composed of one selected from the group consisting of amorphous carbon, diamond like carbon (DLC), graphite, aliphatic or aromatic hydrocarbon compound, organic polymer compound, SiLK™, SiCOH composite material, and a-SiC:H.

8. The method as claimed in claim 1, wherein forming the carbon-containing layer comprises performing a plasma-enhanced chemical vapor deposition (PECVD) method or a spin coating method.

9. The method as claimed in claim 1, wherein the insulating layer pattern is composed of one selected from the group consisting of PE-TEOS, undoped silicate glass (USG), borophosphosilicate glass (BPSG), phosphosilicate glass (PSG), and polysilazane.

10. The method as claimed in claim 1, wherein forming the insulating layer pattern comprises:
    forming an insulating layer on the carbon-containing layer; and
    dry-etching the insulating layer using a photoresist pattern as an etch mask.

11. The method as claimed in claim 10, wherein forming the insulating layer comprises performing a PECVD method or a spin coating method.

12. The method as claimed in claim 10, wherein forming the insulating layer is performed at a temperature equal to or lower than about 450° C.

13. The method as claimed in claim 10, wherein dry-etching the carbon-containing layer to form the carbon-containing layer pattern comprises removing the photoresist pattern simultaneously with the formation of the second hole.

14. The method as claimed in claim 1, wherein forming the carbon-containing layer pattern comprises forming sidewalls of the carbon-containing layer pattern to have a vertical profile.

15. The method as claimed in claim 14, wherein forming the carbon-containing layer pattern comprises dry-etching the carbon-containing layer at a temperature of about 20 to about 80° C.

16. The method as claimed in claim 14, wherein dry-etching the carbon-containing layer comprises using etch gases including $O_2$ gas, an inert gas, and at least one auxiliary gas selected from group consisting of HBr, $NH_3$, and $H_2$, during the formation of the carbon-containing layer pattern.

17. The method as claimed in claim 1, wherein the carbon-containing layer is isotropically dry-etched during the formation of the carbon-containing layer pattern, to form the second hole having a greater outer diameter than that of the first hole.

18. The method as claimed in claim 17, wherein forming the carbon-containing layer pattern comprises dry-etching the carbon-containing layer using etch gases including $O_2$ gas and an inert gas.

19. The method as claimed in claim 1, wherein a height of the carbon-containing layer is equal to or greater than about ⅕ of a height of the bottom electrode.

20. The method as claimed in claim 1, wherein removing the carbon-containing layer pattern comprises performing an ashing process and a stripping process.

21. The method as claimed in claim 1, wherein forming the bottom electrode comprises:
    forming a conductive layer on sidewalls of the carbon-containing layer pattern, on sidewalls of the insulating layer pattern, and on the insulating layer pattern;
    forming a sacrificial layer inside the first hole and the second hole, the sacrificial layer covering the conductive layer;
    removing the sacrificial layer and the conductive layer formed on the insulating layer pattern until an upper surface of the insulating layer pattern is exposed; and
    removing the sacrificial layer completely.

22. The method as claimed in claim 21, wherein the sacrificial layer is composed of one selected from the group consisting of USG, $SiO_2$, polysilazane, and photoresist.

23. The method as claimed in claim 21, wherein removing the sacrificial layer and the conductive layer comprises performing a chemical mechanical polishing (CMP) process or an etch back process.

24. The method as claimed in claim 21, wherein removing the sacrificial layer completely comprises performing a wet etch.

25. The method as claimed in claim 24, wherein the sacrificial layer is composed of an oxide, and
    removing the sacrificial layer completely and removing the insulating layer pattern are performed simultaneously.

26. The method as claimed in claim 21, wherein removing the sacrificial layer completely comprises performing an ashing process and a stripping process.

27. The method as claimed in claim 26, wherein the sacrificial layer is composed of photoresist, and removing the sacrificial layer completely and removing the carbon-containing layer pattern are performed simultaneously.

28. The method as claimed in claim 1, wherein the upper electrode is formed inside the first hole and the second hole.

29. A method of manufacturing a semiconductor memory device, comprising:
forming a carbon-containing layer on a semiconductor substrate;
forming an insulating layer pattern on the carbon-containing layer, the insulating layer pattern partially exposing an upper surface of the carbon-containing layer and defining an upper portion of a storage node hole, the upper portion of the storage node hole having a first diameter;
dry-etching the exposed portion of the carbon-containing layer, to form a carbon-containing layer pattern for defining a lower portion of a storage node hole, the lower portion of the storage node hole having a second diameter greater than the first diameter;
forming a bottom electrode inside the storage node hole;
forming a dielectric layer on the bottom electrode inside the storage node hole, the dielectric layer covering the bottom electrode; and
forming an upper electrode on the dielectric layer inside the storage node hole, the upper electrode covering the dielectric layer.

30. The method as claimed in claim 29, wherein the carbon-containing layer is composed of one selected from the group consisting of amorphous carbon, diamond like carbon (DLC), graphite, aliphatic or aromatic hydrocarbon compound, organic polymer compound, SiLK™, SiCOH composite material, and a-SiC:H.

31. The method as claimed in claim 29, wherein forming the carbon-containing layer comprises performing a plasma-enhanced chemical vapor deposition (PECVD) method or a spin coating method.

32. The method as claimed in claim 29, wherein the insulating layer pattern is composed of one selected from the group consisting of PE-TEOS, undoped silicate glass (USG), borophosphosilicate glass (BPSG), phosphosilicate glass (PSG), and polysilazane.

33. The method as claimed in claim 29, wherein forming the insulating layer pattern comprises:
forming an insulating layer on the carbon-containing layer; and
dry-etching the insulating layer using a photoresist pattern as an etch mask.

34. The method as claimed in claim 33, wherein forming the insulating layer comprises performing a PECVD method or a spin coating method.

35. The method as claimed in claim 33, wherein the insulating layer is formed at a temperature equal to or lower than about 450° C.

36. The method as claimed in claim 33, wherein dry-etching the carbon-containing layer to form the carbon-containing layer pattern comprises removing the photoresist pattern simultaneously with the formation of the lower portion of the storage node hole.

37. The method as claimed in claim 29, wherein forming the carbon-containing layer pattern comprises forming sidewalls of the carbon-containing layer pattern to have a vertical profile.

38. The method as claimed in claim 37, wherein forming the carbon-containing layer pattern comprises dry-etching the carbon-containing layer at a temperature of about 20 to about 80° C.

39. The method as claimed in claim 37, wherein dry-etching the carbon-containing layer comprises using etch gases including $O_2$ gas, an inert gas, and at least one auxiliary gas selected from the group consisting of HBr, $NH_3$, and $H_2$, during the formation of the carbon-containing layer pattern.

40. The method as claimed in claim 29, wherein the carbon-containing layer is isotropically dry-etched during the formation of the carbon-containing layer pattern to form the lower portion of the storage node hole.

41. The method as claimed in claim 40, wherein forming the carbon-containing layer pattern comprises dry-etching the carbon-containing layer using etch gases including $O_2$ gas and an inert gas.

42. The method as claimed in claim 29, wherein a height of the carbon-containing layer is equal to or greater than about ⅕ of a height of the bottom electrode.

43. The method as claimed in claim 29, wherein forming the bottom electrode comprises:
forming a conductive layer on sidewalls of the carbon-containing layer pattern, on sidewalls of the insulating layer pattern, and on the insulating layer pattern;
forming a sacrificial layer inside the storage node hole, to cover the conductive layer;
removing the sacrificial layer and the conductive layer on the insulating layer pattern until an upper surface of the insulating layer pattern is exposed; and
removing the sacrificial layer completely.

44. The method as claimed in claim 43, wherein the sacrificial layer is composed of one selected from the group consisting of USG, $SiO_2$, polysilazane, and photoresist.

45. The method as claimed in claim 43, wherein removing the sacrificial layer and the conductive layer comprises performing a chemical mechanical polishing (CMP) process or an etch back process.

46. The method as claimed in claim 43, wherein removing the sacrificial layer completely comprises performing a wet etch.

47. The method as claimed in claim 43, wherein removing the sacrificial layer completely comprises performing an ashing process and a stripping process.

48. The method as claimed in claim 43, wherein the sacrificial layer is composed of an oxide, and the method further comprises:
prior to forming the dielectric layer, removing the insulating layer pattern by a wet etch; and
removing the carbon-containing layer pattern,
wherein removing the sacrificial layer completely and removing the insulating layer pattern are performed simultaneously.

49. The method as claimed in claim 43, wherein the sacrificial layer is composed of photoresist, and the method further comprises:
prior to forming the dielectric layer, removing the insulating layer pattern by a wet etch; and
removing the carbon-containing layer pattern,
wherein removing the sacrificial layer completely and removing the carbon-containing layer pattern are performed simultaneously.

* * * * *